US006556017B1

(12) United States Patent
Pettersson

(10) Patent No.: US 6,556,017 B1
(45) Date of Patent: Apr. 29, 2003

(54) DETERIORATED FILAMENT DETECTION

(75) Inventor: Åke Pettersson, Brunflo (SE)

(73) Assignee: Safegate International AB, Malmo (SE)

( * ) Notice: Subject to any disclaimer, the term of this patent is extended or adjusted under 35 U.S.C. 154(b) by 0 days.

(21) Appl. No.: 09/807,812

(22) PCT Filed: Oct. 19, 1999

(86) PCT No.: PCT/SE99/01877

§ 371 (c)(1), (2), (4) Date: Jun. 11, 2001

(87) PCT Pub. No.: WO00/24229

PCT Pub. Date: Apr. 27, 2000

(30) Foreign Application Priority Data

Oct. 22, 1998 (SE) .............................................. 9803620

(51) Int. Cl.[7] ........................ G01R 31/00; G01R 31/08; G08B 21/00

(52) U.S. Cl. ........................ 324/414; 324/525; 340/642

(58) Field of Search ................................ 324/414, 72.5, 324/120, 122, 133, 403, 522, 525; 315/131; 340/642

(56) References Cited

U.S. PATENT DOCUMENTS 5,578,998 A * 11/1996 Kasprowicz ................ 315/131
5,675,246 A * 10/1997 Jones ......................... 324/122

FOREIGN PATENT DOCUMENTS

JP 55-165541 12/1980

* cited by examiner

*Primary Examiner*—Christine Oda
*Assistant Examiner*—James Kerveros
(74) *Attorney, Agent, or Firm*—Blank Rome, LLP

(57) ABSTRACT

A Method and an arrangement providing detection of deteriorated lamp filaments (3) in a lamp circuit (11) fed by constant current, in particular for a lamp supervision system for airfield lights. A change in a constant current fed through a lamp circuit (11) is initiated, whereby the lamp filament resistance is determined once in conjunction with the change in current and once a time period later. A difference between the resistance determinations constitutes the deterioration of a lamp filament (3) in comparison with a threshold value. Hence, no record of previous resistance determinations have to be stored, and lamps (4) can be replaced when the difference matches the threshold value.

20 Claims, 2 Drawing Sheets

DETERIORATED FILAMENT DETECTION

TECHNICAL FIELD

The present invention pertains to a method and an arrangement for providing detection of deteriorated lamp filaments in a lamp circuit fed by constant current, especially for incandescent lamps comprised in airport lighting systems.

PRIOR ART

At airports, lighting systems are used for directing airplanes during landing and taxiing. These lighting systems have a large number of lamps and it is important that failed lamps are replaced quickly, especially during times of low visibility. Otherwise, the consequences of a plane missing a taxiway or a stop signal can be disastrous. Since visual lamp inspection increases the risk for an accident and induce costs, automatic lamp monitoring systems have been developed.

Lamps in these lighting systems are frequently connected into a so-called series circuit using an isolation transformer for each lamp. Such lamps are connected in series via a power cable and fed by a constant current power supply from a constant current regulator (CCR). During a lamps burning time its brightness deteriorates. This is partly due to the fact that material evaporates from the filament, which usually has a helical shape, and sublimates onto the glass bulb where it absorbs part of the emitted light. The probability for this to happen is, however, rather low as the type of lamp used is designed such that the evaporated material sublimates onto the filament again.

A more probable reason for lamp degradation is that the evaporated material sublimates in such a way that shorting bridges are formed between adjacent filament coil turns. If a part of the filament in a lamp fed with constant current is shorted, the nominal wattage of the lamp is reduced as it is proportional to the resistance of the filament. Hence, the lamp intensity will be reduced. Eventually the lamp fails due to a complete shortage or, more often, a breakage in the filament. This is opposed to the case when a lamp is fed with constant voltage. Then its nominal wattage is inversely proportional to the filament resistance (Intensity$\approx$wattage$^2$), and shortage of the filament will cause it to burn off more or less immediately due to an excessive power dissipation.

In the case a lamp fails due to a breakage in the filament, a high voltage arises on the primary and on the secondary side of the isolating transformer connected to the lamp, as the impedance on the secondary side of the transformer then becomes infinite. High voltage appears at the beginning of each cycle of an AC current fed through the transformer.

Isolating transformers used, however, can be designed such that a high voltage only appears for a short time whereafter the transformer core is saturated. When the core is saturated the voltage across the transformer drops to a low value as the impedance of the transformer thus is low.

In case a lamp fails due to a shortage of the filament, the voltage across the transformer is only slightly reduced. This is true when there is a considerable voltage drop in a long cable between the transformer and a lamp.

Known lamp monitoring systems, which are for sale, detect lamp failures due to filament breakage. A common type monitors the current and the voltage supplied by the constant current, and the voltage supplied by the constant current power supply to the series circuit, thereby detecting impedance changes in the circuit caused by failed lamps.

A further type of monitoring system includes a monitoring unit located at each lamp, where the monitoring unit detects a voltage increase that occurs at each half period of the current before the isolating transformer core saturates, or the monitoring system simply detects a "no current" condition in a open circuit.

None of the systems detect partly or completely shorted filaments.

As lamps deteriorate in a fairly predictable way before they fail there are also systems that predict lamp failure based on a lamps burn time. A record is held for each series circuit regarding the accumulated time the circuit has been switched on. In an advanced version, a separate accumulated time record is held for a maximum current value, or for each current value at which the circuit is energised. Based on these records the lamps are replaced after a certain, empirically established, burn time.

A complicating factor is that lighting systems are becoming common which allow for selective switching, i.e., not all lights in a series circuit are turned on and off together. Only those lights that are necessary to guide an aircraft at a particular moment are turned on and off at the same time, which makes it rater complicated to predict the remaining lifetime for each lamp based on its burn time combined with the intensity used.

The present invention provides detection of deteriorated lamp filaments in accordance with attached independent method and arrangement claims. Embodiments of the invention are defined through attached dependent claims.

SUMMARY OF THE DISCLOSED INVENTION

The present invention attains to provide a detection method for a monitoring system, which makes it possible to detect a partially or completely shorted lamp in a lamp circuit fed by constant currents.

In doing so, a method is set forth, providing detection of deteriorated lamp filaments in a lamp circuit fed by constant current. When a change in the constant current fed through the lamp circuit is initiated, the resistance, once in conjunction with the current, change and once a predetermined time period later is determined or measured, whereby the difference between the resistance determinations or measurements constitutes the deterioration of a lamp filament in comparison with a threshold value for said difference, thereby avoiding a record keeping of previous resistance measurements.

One embodiment of the invention comprises that a lamp should be replaced when said resistance difference is equal to or smaller then the threshold value.

A further embodiment comprises that a resistance is determined by measuring the voltage across a lamp circuit and across a resistor placed in series with the lamp circuit, whereby the quotient between said determined values multiplied with the value of said resistor is equal to the resistance of the lamp circuit.

A still further embodiment comprises that said threshold value is different for different current values.

Another embodiment comprises that said threshold value is different for different nominal wattage of lamps.

Yet in one other embodiment said threshold values are empirically established for each current value.

Also, according to the present invention, a monitoring arrangement is set forth providing detection of deteriorated lamp filaments in a lamp circuit fed by constant current. It comprises:

lamp monitoring means connected to said lamp circuit, which detects that a change in said constant current is initiated to flow through said lamp circuit;

resistance determining or measuring means, which determine or measure a resistance value across a lamp circuit once in conjunction with said current change and once a predetermined time period later;

difference determining or measuring means measuring a difference value between said determined or measured resistance values;

evaluation means for evaluating said resistance difference value compared with threshold value for said difference; and whereby the difference between the resistance measurements constitutes the deterioration of a lamp filament compared with said threshold value, thereby avoiding a record keeping of previous resistance measurements.

Further the arrangement is able to set forth steps of the above method as described in the method claims.

BRIEF DESCRIPTION OF THE DRAWINGS

For a more complete understanding of the present invention and objectives and advantages thereof, reference may now be had to the following description in conjunction with the accompanying drawings, in which.

DETAILED DESCRIPTION OF PREFERRED EMBODIMENTS

The present invention uses the fact that when a current is fed through an incandescent lamp, the filament is heated and the resistance of the filament is a function of the filament temperature. The resistance of a hot filament may be several times higher than the resistance of a cold filament. If the value of the current fed through the lamp is changed, the filament temperature and resistance reaches a steady state value after a time period, typically several seconds, after the current has reached its steady state value.

Figure 1:
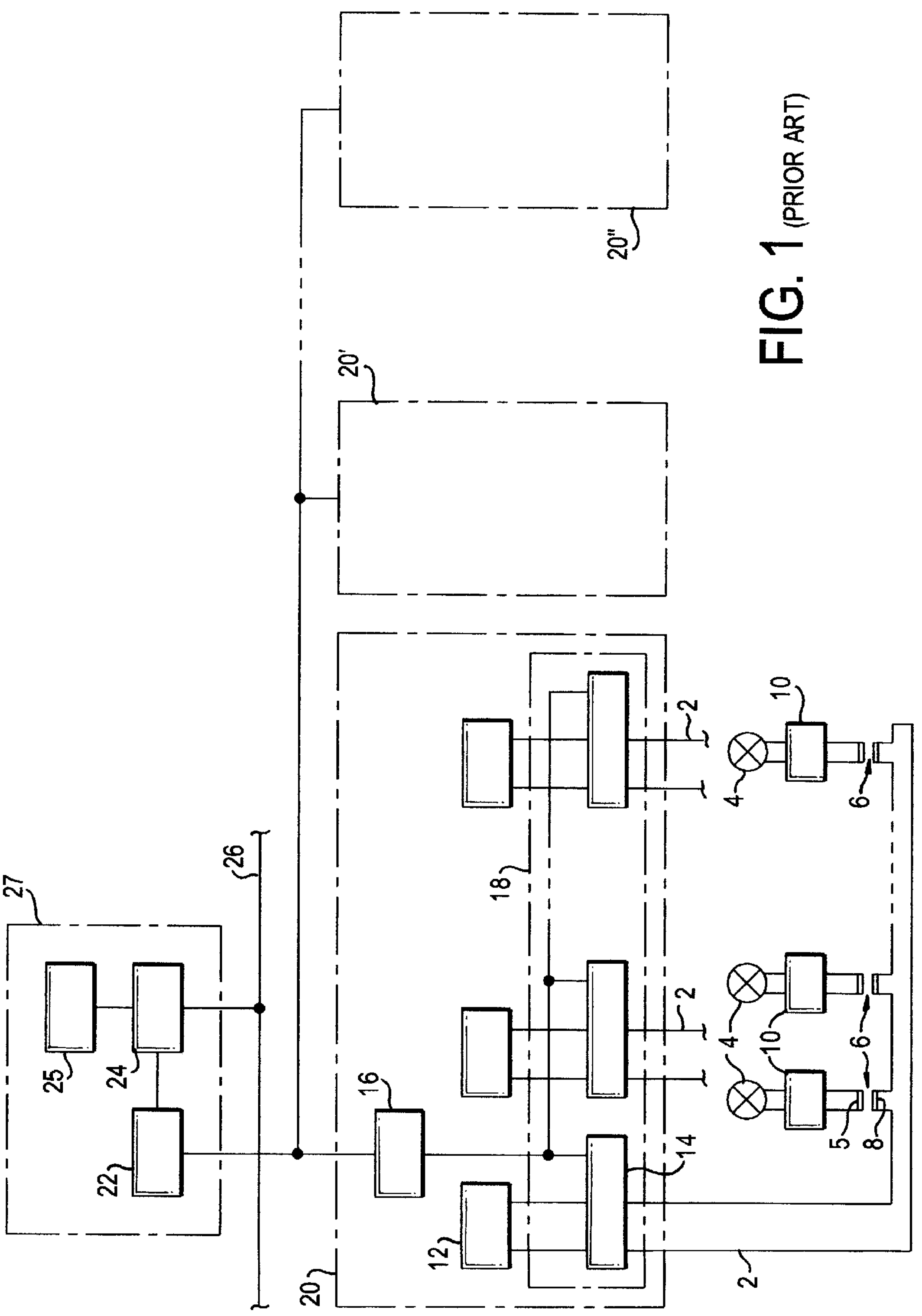
FIG. 1 (PRIOR ART)
FIG. 1 schematically illustrates a prior art airfield lighting system.

FIG. 1 illustrates a prior art airfield lighting system according to principles as taught in relating copending international applications published as WO 94/13119 and WO 95/24820 assigned to the assignee of the present invention entitled "Systems and Methods for Transmitting Pulse Signals" by Lars Millgård and "Communication on a series cable" by Lars Millgård et al, respectively. The present invention is able to utilize such a system for the performance of its objectives.

The airfield lighting monitoring system shown in FIG. 1 includes a number of current supply loops 2 for lamps 4, only one of said loops being shown in its entirety in the Figure. Each lamp 4 is connected to its associated loop 2 via a secondary winding 5 of an isolation transformer 6, the primary winding 8 of which is series connected in the current supply loop, and via a light monitor switch (LMS) 10. Each current supply loop 2 is fed by a constant current regulator (CCR) 12 via a communicating Series Circuit Modem (SCM) 14. A concentrator unit (CU) 16 is connected in a multi-drop configuration to a group 18 of the communicating units 14. The units 14 and 16 will be described more closely below.

The CU unit 16 and its associated elements, described above, together form a sub-unit 20, which can e.g. be devoted to a certain part of the lighting system of an air field. The lighting system can include a required number of similar sub-units, of which some are indicated at 20' and 20".

The CU units 16 in said sub-units are connected to a central concentrator unit 22 via multi-drop modems.

The central CU unit 22 can be connected to a computer 24 with a display 25. The computer 24 can be further connected to other systems via for example a local area network (LAN) 26. The unit 22 and computer 24 can e.g. be localized in a control room 27, or at some other suitable place.

An SCM unit 14 detects responses from the LMS modules and reports the addresses of nonresponding modules via the local CU unit 16 to the central concentrator unit 22. In the central concentrator unit 22, the addresses are stored in a database accessible to the computer 24 in the control room 27.

On the display 25 the number of failed lamps 4 and the position of each failed lamp can be displayed. Different alarm criteria can be set in the central concentrator unit 22 via the computer 24.

The communication between the LMS modules and the associated communicating unit is carried out by high frequency signals superimposed on the 50 Hz or 60 Hz current in the power cable.

Figure 2:
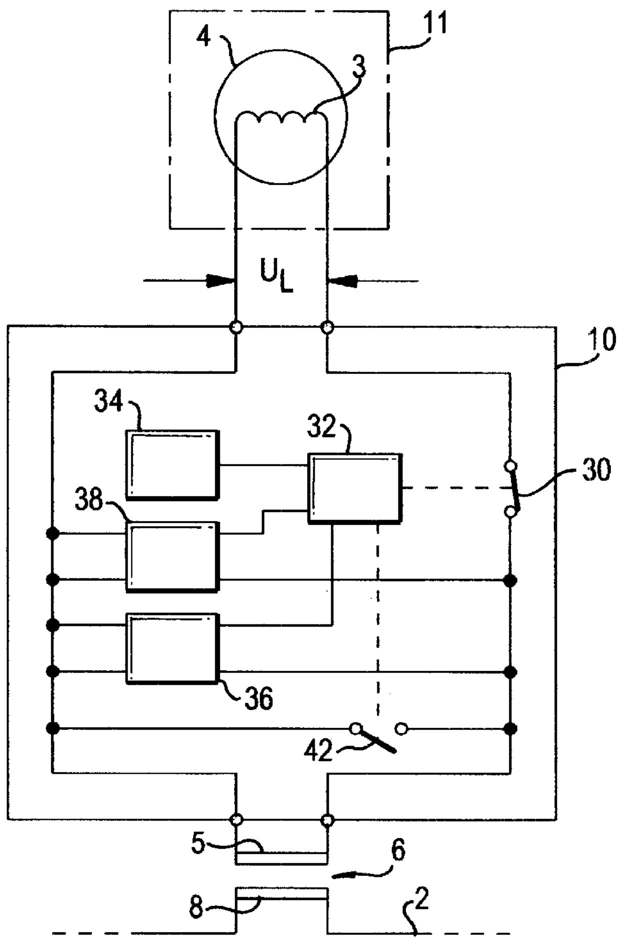
FIG. 2 (PRIOR ART)
FIG. 2 schematically illustrates a prior art lamp circuit.

A schematic block diagram of a LMS module 10 is shown in FIG. 2, also illustrating the connection of the lamp 4 with a filament 3 into circuit with the secondary winding 5 of the transformer 6.

The LMS module 10 is schematically shown to include a switch 30 in series with the lamp 4 connected for interrupting the current in the lamp circuit. The module 10 furthermore includes a control circuit or logic unit 32, e.g. a microprocessor for controlling the switch 30, an address memory 34 for storing the above mentioned address thereof and a receiver 36 connected for receiving i.a. the synchronization signal from the unit 14 and forwarding it to the logic unit 32 the module 10 also contains a dc power supply unit 38 for the logic unit 32 and receiver 36.

Also connected over the secondary winding 5, and thus in parallel with the lamp 4, is a switch 42 controlled by the control circuit 32. In a manner known to a person skilled in the art, the design of the switch 30 can e.g., be based on the use of field-effect transistors.

The memory for storing the address of each LMS module 10 can be a PROM-memory.

According to the present invention it sets forth a method comprising a measurement of the resistance of a lamp circuit 11, depicted in FIG. 2, in connection with a change in the value of the lamp current. The change can either be due to that the setting of the constant current regulator has been changed or by a short disruption in the current induced by a switching function in the monitoring unit to create the necessary current change, so called intensity control.

A measurement is made at least at two times shortly after that the value of the current feeding the lamp has changed. Firstly directly after the change and secondly when it has reached its steady state value, whereby it is judged to be partly or completely shorted dependent on the difference between the two resistance values achieved. Limiting or threshold values $\Delta Tr$, see FIG. 3, can be empirically established for each current value used.

One method to measure the resistance in a lamp circuit comprises to measure the voltage across the lamp circuit and across a resistor (not shown) placed in series with the lamp circuit. The quotient between these voltages multiplied with the value of the resistor is equal to the resistance of the lamp circuit.

The resistance of a lamp, used for airfield lighting, is of the same order as the cable supplying the lamp. The resistance of a 45 W lamp fed by 6.6 A, which is a common current used in bad visibility, is in the order of 1 ohm. The resistance of the same lamp fed by 2.8 A, which is a common current used during good visibility, is about 0.5 Ω. A typical supply cable has a resistance of about 0,014 Ω/m for one pair of 2,5 $mm^2$ conductors.

In monitoring systems, where lamps are individually monitored, a monitoring unit is not likely to be located together with the lamp. Lack of space locates the monitoring unit together with the isolation transformer in a transformer pit. Hence the secondary cable from the monitoring unit to the lamp can typically have a length of 30 to 40 m, which corresponds to a resistance in the order of 0,5 Ω. A change in resistance, even due to a complete filament shortage, can therefore be very small in comparison with the resistance of the cables.

Furthermore, the cable resistance varies as a function of the cable temperature, which is another complicating factor when impedance measurements are carried out from a distance.

Figure 3:
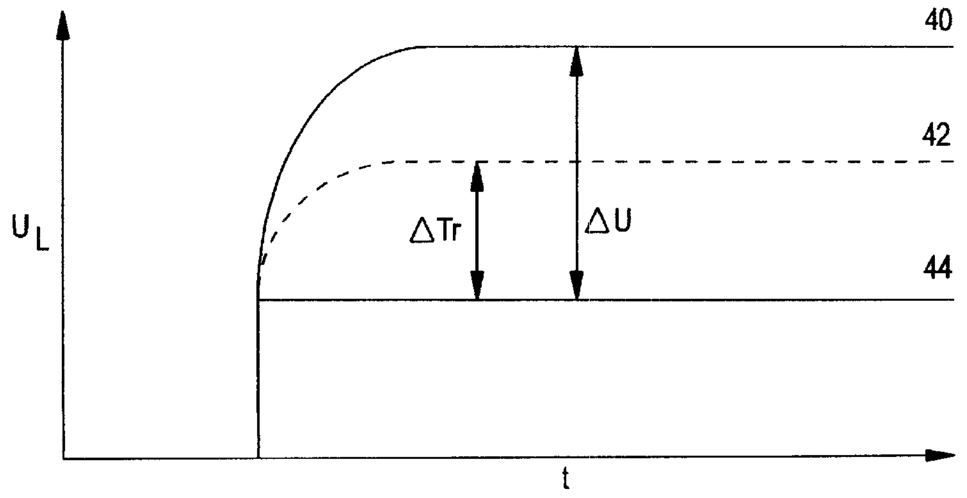
FIG. 3 schematically illustrates how a lamp filament resistance changes in time.

FIG. 3 schematically illustrates how a lamp filament resistance changes in time. In order to determine the filament resistance, the voltage $U_L$ across the lamp circuit 11 is measured on a time basis t.

It is schematically illustrated in FIG. 3 how the voltage $U_L$ would be on a constant higher voltage in time, curve 40, if the lamp 4 did not deteriorate or be partly shorted. Further, curve 42, a broken line, depicts how the voltage drops when the lamp is deteriorated or partly shorted. Finally it can be seen how the voltage $U_L$ drops to a lower constant value 44 for a totally shorted lamp. A cold filament has a resistance value coinciding with the resistance value for a shorted lamp in accordance with the constant voltage 44 of a totally shorted lamp 4.

Although not depicted in FIG. 3, it should be appreciated that there are an infinite number of curves 42 for the voltage drop of partly shorted or deteriorated lamps 4.

Furthermore, the present invention comprises a monitoring arrangement providing detection of deteriorated lamp filaments in a lamp circuit fed by constant current.

The arrangement provides a lamp monitoring means 10 connected to the lamp circuit 11, which among other tasks detects that a change in said constant current is initiated to flow through the lamp circuit. The control unit 36 measures the voltage drop ΔTr in this embodiment of the invention. Further, in accordance with the schematic drawing in FIG. 3, and as an example of a threshold value, ΔTr is set as the limiting or threshold value, so when the voltage $U_L$ drops to the constant voltage level 42 due to lamp deterioration, the LMS circuit 10 signals, e.g. to the CU 22, that a replacement of lamp 4 must be accomplished.

It further provides resistance determining means, which determine a resistance value across a lamp circuit 11 i.a. by measuring voltage levels as described above, once in conjunction with said current change and once a predetermined time period later. In order to determine and evaluate the above determined resistance, a difference measuring means measuring the difference value between the measured resistance values and a evaluation means for evaluating said resistance difference value compared with a threshold value for said difference is provided.

Hence, the difference between the determined resistance constitutes the deterioration of a lamp filament compared with the resistance threshold value deduced out off the described voltage drop measurements. This accomplishes that a record keeping of previous resistance determinations or measurements is unnecessary. It is thus established, in real time, how much the lamp filament has been shorted, or the deterioration of it, by comparing the measurements made with a threshold value.

A lamp can thus be replaced when the resistance difference is equal to or smaller then the resistance threshold value, which is proportional to the voltage threshold value ΔTr in accordance with Ohm's law.

In one embodiment of the present invention a resistance is measured and determined by measuring the voltage across a lamp circuit and across a resistor (not shown) placed in series with the lamp circuit 11. The quotient between the determined values multiplied with the value of the resistor is equal to the resistance of the lamp circuit.

Also, in another embodiment, the threshold value is different for different current values, which is advantageous in taking account for different operation conditions regarding the loops 2, including lamps, such as heavy load, minor load etc. As loops 2 for airfield lighting installations differ from airport to airport and even from loop to loop it is appreciated that the threshold values are empirically established for each current value in one embodiment of the present invention.

While the present invention has been described in conjunction with specific embodiments thereof, it is evident that alternatives, modifications, and variations will be apparent to persons skilled in the art in light of the foregoing description and appended claims.

What is claimed is:

1. A method providing detection of deteriorated lamp filaments (3) in a lamp circuit (11) fed by constant current from a switching or regulating device, characterized in determining a resistance value across the lamp circuit once in conjunction with a current change caused by the switching or regulating device and once a predetermined time later, whereby the difference between the resistance determinations constitutes the deterioration of a lamp filament (3) in comparison with a threshold value for said difference, thereby avoiding a record keeping of previous resistance determinations.

2. A method according to claim 1, characterized in that a lamp (4) should be replaced when said resistance difference is equal to or smaller than the threshold value.

3. A method according to claim 1, characterized in that a resistance is determined by determining the voltage ($U_L$) across a lamp circuit (11) and across a resistor placed in series with the lamp circuit, whereby the quotient between said determined values multiplied with the value of said resistor is equal to the resistance of the lamp circuit (11).

4. A method according to claim 3, characterized in that said threshold value is different for different current values.

5. A method according to claim 4, characterized in that said threshold values are empirically established for each constant current.

6. A method according to claim 3, characterized in that said threshold value is different for different nominal wattages of lamps.

7. A method according to claim 6, characterized in that said threshold values are empirically established for each constant current.

8. A method according to claim 1, characterized in that said threshold value is different for different current values.

9. A method according to claim 8, characterized in that said threshold values are empirically established for each constant current.

10. A method according to claim 1, characterized in that said threshold value is different for nominal wattages of lamps.

11. A method according to claim 10, characterized in that said threshold values are empirically established for each constant current.

12. A monitoring arrangement providing detection of deteriorated lamp filaments (3) in a lamp circuit (11) fed by constant current from a switching or regulating device, characterized in that it comprises:

lamp monitoring means (10) connected to said lamp circuit (11), which detects that a change in said constant current is caused by the switching or regulating device to flow through said lamp circuit (11);

resistance determining means, which determine a resistance value across said lamp circuit (11) once in conjunction with said current change and once a predetermined time period later;

difference determining means determining a difference value between said determined resistance values;

evaluation means for evaluating said resistance difference value compared with a threshold value for said difference; and whereby the difference between the resistance determinations constitutes the deterioration of a lamp filament (3) compared with said threshold value (ΔTr), thereby avoiding a record keeping of previous resistance determinations.

13. An arrangement according to claim 12, characterized in that a lamp (4) can be replaced when said resistance difference is equal to or smaller than the threshold value.

14. An arrangement according to claim 12, characterized in that a resistance is determined by measuring the voltage across a lamp circuit (11) and across a resistor placed in series with the lamp circuit, whereby the quotient between said determined values multiplied with the value of said resistor is equal to the resistance of the lamp (11).

15. An arrangement according to claim 14, characterized in that said threshold value (ΔTr) is different for different current values.

16. An arrangement to claim 14, characterized in that said threshold value (ΔTr) is different for different nominal wattages of lamps (4).

17. An arrangement according to claim 14, characterized in that said threshold values (ΔTr) are empirically established for each current value.

18. An arrangement according to claim 12, characterized in that said threshold value (ΔTr) is different for different current values.

19. An arrangement according to claim 18, characterized in that said threshold values (ΔTr) are empirically established for each current value.

20. An arrangement to claim 12, characterized in that said threshold value (ΔTr) is different for different nominal wattages of lamps (4).

* * * * *